Dec. 16, 1969 G. J. SHOMPHE 3,483,616
METHOD FOR PRODUCING A PRINTED CIRCUIT BOARD
Original Filed Jan. 23, 1964 2 Sheets-Sheet 1

INVENTOR.
GEORGE J. SHOMPHE
BY Philip D. Amins

METHOD FOR PRODUCING A PRINTED CIRCUIT BOARD

Original Filed Jan. 23, 1964

2 Sheets-Sheet 2

INVENTOR.
GEORGE J. SHOMPHE
BY Philip D. Amins 3,483,616

METHOD FOR PRODUCING A PRINTED CIRCUIT BOARD

George J. Shomphe, Nashua, N.H., assignor to Sanders Associates, Inc., Nashua, N.H., a corporation of Delaware Original application Jan. 23, 1964, Ser. No. 339,712, now Patent No. 3,298,588, dated Jan. 17, 1967. Divided and this application Oct. 20, 1966, Ser. No. 588,208
Int. Cl. B41m *3/08;* H05k *3/00*
U.S. Cl. 29—625 7 Claims

ABSTRACT OF THE DISCLOSURE

A method used in the manufacture of printed circuit boards and a machine useful in connection with the method are described. An insulating board has conductor patterns on each side and is formed with holes through the board and through opposite registering conductive areas where interconnections are desired. The board is covered with a protective coating except in these conductive areas surrounding the holes and then these areas are tinned by spray soldering. The excess solder is immediately blasted off by a stream of fluid which also clears solder from the holes. Next an eyelet is inserted into each hole and the entire board again subjected to spray soldering followed by application of blast-off fluid which removes excess solder and leaves the eyelets open. Also described is a machine for automatically fluxing, spraying solder, applying streams of blast off fluid and degreasing the printed circuit boards.

This invention relates to "printed circuit boards," or "printed circuits," and, more particularly, to a method for soldering printed circuit boards to provide improved connections to the conductors of the circuit board, and is a division of my co-pending patent application Ser. No. 339,712, filed Jan. 23, 1964 and entitled "Printed Circuit Board and Machine for Soldering Same," now U.S. Patent No. 3,298,588 issued Jan. 17, 1967.

It is well-known that, in employing printed circuits, and particularly circuits on both sides of the board, difficulties are encountered in establishing solder connections to the board and from conductors on one side to conductors on the other side of the board, especially when the soldering is done by a machine instead of manually.

Heretofore, connections to the board conductors have frequently been made by drilling through the board in a conductor area on one or both sides of the board and applying a protective coating where solder is not desired. After this, the board is dip-soldered and shaken to remove the excess solder clinging to the eyelet area. The difficulties mentioned above interfere with establishing a rigid mechanical connection and a solid and reliable electrical connection to the board conductor. An excess amount of solder almost invariably remains, forming an uneven coat around the eyelet area, which makes it difficult to seat the eyelet properly and frequently results in air pockets being formed under the eyelet. This is likely to introduce circuit noise. Another difficulty is that the hole provided for the eyelet is left filled with solder, and a separate operation is necessary to open it before the eyelet can be inserted.

It is therefore an object of the present invention to provide a method for soldering printed circuit boards by means of spray soldering and liquid blast-off to remove excess solder.

It is another object of the present invention to provide a method for soldering printed circuit boards which forms a smooth, even deposition of solder upon said board.

It is a more particular object of the present invention to provide a method for soldering eyelets to printed circuit boards which will result in the eyelet being solidly and rigidly seated therein, thereby resulting in both good electrical and mechanical connections which will prevent circuit noise.

It is a further object of the present invention to provide a method for soldering eyelets to printed circuit boards which will leave the eyelet open, thereby eliminating the necessity of punching solder out of the eyelet holes.

It is still a further object of the present invention to provide a method for soldering printed circuit boards which will result in new and improved connections to the circuit board and between conducting areas disposed on opposite sides of the circuit board.

Still other objects and advantages of this invention will be apparent from the specification.

The features of novelty which are believed to be characteristic of this invention are set forth with particularity in the appended claims. The invention itself, however, both as to its fundamental principles and as to its particular embodiments, will best be understood by reference to the specification and accompanying drawings, in which:

Figures 1, 2, 3, 4:
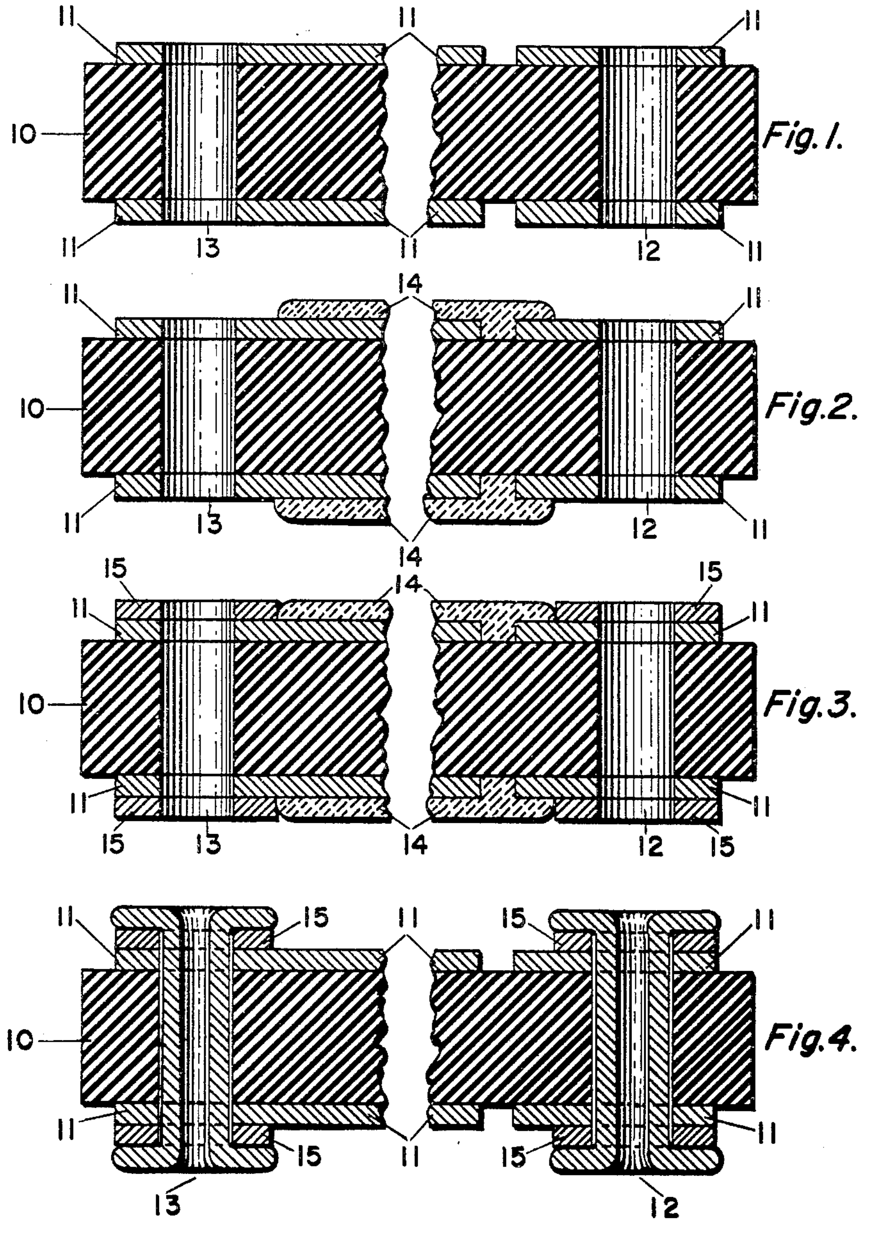
FIG. 1 is a sectional view of a printed circuit board before soldering, somewhat enlarged for clarity.
FIG. 2 is a similar view after the addition of a compound to protect the board from solder in undesired areas.
FIG. 3 is a similar view after the first application of solder (tinning)
FIG. 4 is a similar view after insertion of the eyelets and second soldering.

Referring now more particularly to FIG. 1, it is well-known that a printed circuit board is prepared by employing a laminate consisting of a layer of insulating material, to one or both sides of which a sheet or sheets of conductor, such as copper, is attached. The board is then covered with a resist, except where the copper is to remain, and etched to remove the undesired conductor material, leaving the desired pattern of conductors on one or both sides of the board.

In FIG. 1, 10 represents the layer of insulating material carrying the residual conductor pattern 11 left after etching, and having eyelet holes 12 and 13 to receive eyelets usually punched or drilled after etching is completed.

According to this invention, the conductor pattern is prepared for passage through the soldering machine by coating it with a protective coating 14, shown in FIG. 2, such a hysol, except in the eyelet or other areas to be tinned. Thus prepared, the board is passed through the soldering machine, which applies a layer of solder 15 in the unprotected areas of the conductor pattern, as shown in FIG. 3. The steps which occur in the soldering machine will be described later in more detail, but include those of fluxing, soldering, blasting off excess solder, and degreasing.

Each board is run through the machine twice. On the first run, the contact areas for the eyelets are tinned. Before running through the machine the second time, the eyelets are inserted. During the second run, the eyelet areas are fluxed, soldered to the eyelet, and the excess solder is blasted off, forming an even deposit of solder with a smooth surface. If desired, the cover coat can be removed to produce the result shown in FIG. 4. This results in a rigid and reliable mechanical and electrical connection without air pockets under the eyelet and with freedom from circuit noise which would otherwise be introduced. Also, the blast-off during the first run prevents the eyelet holes from being filled with solder, which otherwise have to be removed before insertion of the eyelets. Similarly, the blast-off during the second run clears the eyelets of solder for component insertion.

Figures 5, 6:
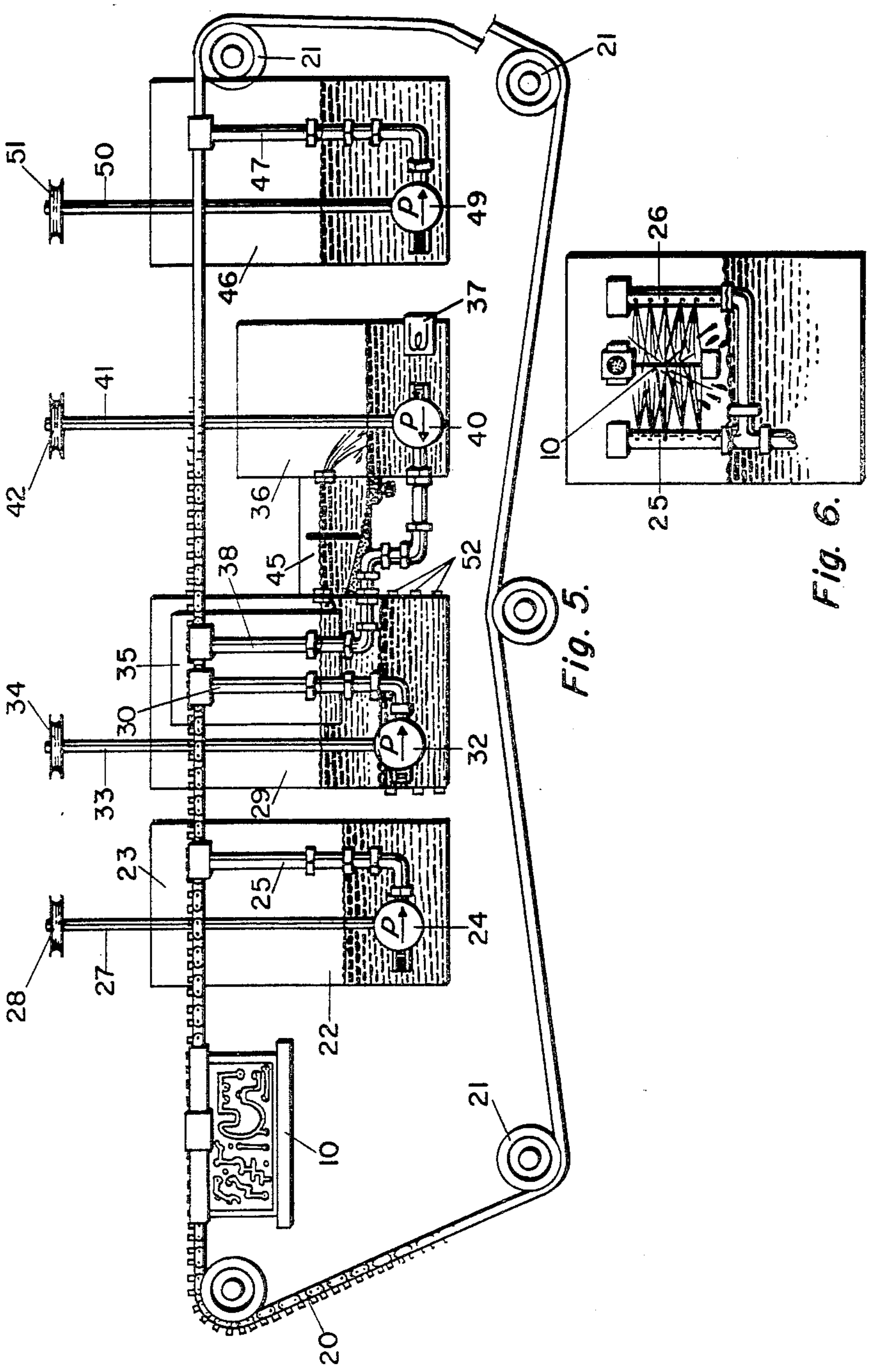
FIG. 5 is a partial sectional elevation of a soldering machine according to this invention.
FIG. 6 is a detail vertical sectional elevation of the sprays which are applied to both sides of the boards simultaneously.

A machine particularly adapted to the process of this invention is shown in FIG. 5, to which reference is now had. A conveyor belt 20, to which the circuit board 10 is attached, passes around rollers 21. As shown, the board 10 is attached to conveyor 20 at the left side of FIG. 5 and travels to the right, first passing through the flux tank 22 and through flux spray 23. The flux liquid in this instance is rosin flux with isopropyl alcohol as a diluent, although other liquid fluxing compounds may be used.

The liquid flux in the flux tank 22 is pumped by pump 24 to vertical spray nozzles 25 and 26, which spray inward against board 10 as it passes between them, as shown more in detail in FIG. 6, the excess spray drainig off from the board and falling back into the tank. Pump 24 may be driven by shaft 27, carrying drive pulley 28, energized from any suitable power source, such as a belt driven by an electric motor (not shown).

The board 10 is then carried by conveyor 20 out of the fluxing tank 22 and into the soldering and blast-off tank 29, where solder is sprayed on both sides of the board 10 by two vertical solder spray nozzles 30, arranged as are the nozzles 25 and 26 in FIG. 6. Liquid solder in the tank 29 is heated electrically by coils 52 and picked up by pump 32, driven by shaft 33 through drive pulley 34, energized similarly to pulley 28. A removable baffle 35 is provided in this example of the invention, to confine the solder and blast-off operations to a small section of the tank 29, thereby preventing build-up of solder deposits on the tank walls.

The excess solder is blasted off both sides of the board almost immediately after soldering. The blast-off medium in this instance is peanut oil, although other suitable substances may be used. The blast-off liquid is stored in a separate tank 36, provided with a heating coil 37, and is pumped to the spray nozzles 38 by pump 40 driven by shaft 41 and drive pulley 42. The blast-off nozzles 38 are located close to the solder spray nozzles 30, about two inches downstream, which results in the blast-off occurring within two or three seconds after application of the solder. Because of the close proximity of the solder and blast-off nozzles, the solder is still in a molten liquid state when blast-off occurs, and a relatively low-blast-off pressure will clear the eyelet area of solder and form a smooth, even coat of solder around the eyelet. The solder settling tank 45, between the solder and blast-off tank and the blast-off liquid storage and heating tank, allows the blast-off oil to return to storage tank 36 relatively free of entrained solder.

The circuit board 10, after solder and blast-off, passes to the degreasing tank 46, passing between vertical spray nozzles 47, where it is sprayed with an suitable degreasing liquid, impelled by pump 49, driven by shaft 50 and drive pulley 51. The board then passes out of the degreasing tank and is ready to be removed from the conveyer. The eyelet areas are now tinned (first run) or the eyelets soldered (second run). Before the next run can be made on a board which has passed through the machine, all traces of the blast-off oil must be removed. This usually requires a second step in the degreasing process, wherein the board is removed from the conveyor and placed in a solvent vapor bath, such as trichloroethylene, or the equivalent. After final degreasing, the board is ready for its second run through the machine, or for component mounting, as the case may be.

In the foregoing specification, there is described the best mode of practicing the invention presently known to me, and for certain cases the preferred form, but it will be understood that modifications and changes may be made without departing from the spirit and scope of this invention, as will be clear to those skilled in the art.

What is claimed is:

1. The method of producing a printed circuit board having an insulating base and a pattern of conductors on each side of said base, each pattern including a registering contact areas having a hole to receive an eyelet, which method comprises the steps of first tinning said contact areas by spray soldering the same, then blasting off excess solder to provide a smooth, even deposit of solder around said hole, then inserting an eyelet into said hole, and then spray soldering said eyelet to said tinned areas, so as to form a rigid mechanical connection and a solid, reliable electrical connection between said eyelet and said tinned areas, wherein there are not air pockets formed beneath said eyelet.

2. The method claimed in claim 1, which includes the step of blasting off excess solder from said tinned areas while said solder is still in a molten state.

3. The method of producing a printed circuit board having an insulating base and a pattern of conductors on each side including registering contact areas having a hole for receiving an interconnecting eyelet, which method comprises the steps of applying a protective coating to said patterns except for said contact areas, spraying said circuit board with flux, then spraying said circuit board with solder, then blasting off excess solder with a blast-off medium to thereby form a smooth, even seat for said eyelet, and then degreasing said circuit board to remove said blast-off.

4. The method claimed in claim 3, including the additional steps of inserting an eyelet into said hole, spraying said circuit board with flux, then spraying said circuit board with solder, then blasting off excess solder, and finally degreasing said circuit board.

5. The method claimed in claim 4, wherein the excess solder is blasted off while the same is still in a molten state.

6. The method claimed in claim 3, wherein said blast-off medium is a fluid whose temperature is sufficiently high to maintain the solder in a molten state.

7. The method of interconnecting conductor patterns on opposite sides of an insulating board having holes formed therein through registering contact areas where interconnections are desired, comprising the steps of applying a protective coating to both sides of said insulating board except for said contact areas, spraying both sides of said board with molten solder, applying streams of fluid to said board to remove excess solder from said contact areas and to clear solder from said holes, inserting an eyelet into each of said holes, spraying both sides of said board with molten solder and applying streams of fluid to said board to remove excess solder and to leave said eyelets open.

References Cited

UNITED STATES PATENTS

| | | | |
|---|---|---|---|
| 2,092,191 | 9/1937 | Thomas | 29—502 XR |
| 2,251,642 | 8/1941 | Tilley | 113—1 XR |
| 2,370,495 | 2/1945 | Sebell | 118—63 |
| 2,756,485 | 7/1956 | Abramson et al. | |
| 2,861,911 | 11/1958 | Martin et al. | 29—625 XR |
| 3,079,672 | 5/1963 | Bain et al. | |
| 3,106,436 | 10/1963 | Weiss. | |
| 3,143,787 | 8/1964 | Babb. | |
| 3,239,373 | 3/1966 | Hoodwin | 117—212 |
| 3,277,566 | 10/1966 | Christiansen | 29—488 XR |

JOHN F. CAMPBELL, Primary Examiner

RICHARD B. LAZARUS, Assistant Examiner

U.S. Cl. X.R.

29—488, 502, 630; 117—212